(12) United States Patent
Wen

(10) Patent No.: US 10,456,795 B2
(45) Date of Patent: Oct. 29, 2019

(54) NOZZLE ADJUSTMENT DEVICE AND NOZZLE ADJUSTMENT METHOD

(71) Applicants: HKC Corporation Limited, Shenzhen, Guangdong (CN); Chongqing HKC Optoelectronics Technology Co., Ltd., Chongqing (CN)

(72) Inventor: Chun-Bin Wen, Chongqing (CN)

(73) Assignees: HKC CORPORATION LIMITED, Shenzhen, Guangdong (CN); CHONGQING HKC OPTOELECTRONICS TECHNOLOGY CO., LTD., ChongQing (CN)

( * ) Notice: Subject to any disclaimer, the term of this patent is extended or adjusted under 35 U.S.C. 154(b) by 173 days.

(21) Appl. No.: 15/550,912

(22) PCT Filed: May 19, 2017

(86) PCT No.: PCT/CN2017/085156
§ 371 (c)(1),
(2) Date: Aug. 14, 2017

(87) PCT Pub. No.: WO2018/201530
PCT Pub. Date: Nov. 8, 2018

(65) Prior Publication Data
US 2018/0318850 A1    Nov. 8, 2018

(30) Foreign Application Priority Data

May 2, 2017   (CN) .......................... 2017 1 0302180

(51) Int. Cl.
*B05B 1/20*   (2006.01)
*B05B 15/658*   (2018.01)
(Continued)

(52) U.S. Cl.
CPC .............. *B05B 1/20* (2013.01); *B05B 15/652* (2018.02); *B05B 15/658* (2018.02); *B05B 15/68* (2018.02); *H01L 21/67051* (2013.01)

(58) Field of Classification Search
CPC ......... B05B 1/20; B05B 15/658; B05B 15/68; B05B 15/652; H01L 21/67051
(Continued)

(56) References Cited

U.S. PATENT DOCUMENTS 9,289,783 B2 *   3/2016   Wang ...................... B05B 15/68
9,657,819 B2 *   5/2017   Sebert ..................... B24B 55/02

FOREIGN PATENT DOCUMENTS

CN   202343598 U   *   7/2012
CN   206185758 U   *   5/2017

* cited by examiner

*Primary Examiner* — Jason J Boeckmann
(74) *Attorney, Agent, or Firm* — Locke Lord LLP; Tim Tingkang Xia, Esq.

(57) ABSTRACT

An adjustment device includes: an adjustment sheet; a spray pipe positioning unit, including spray pipe positioning holes and two spray pipe positioning bolts; and a nozzle positioning unit, including a nozzle positioning hole disposed at the center of the adjustment sheet and an angle fixing portion homocentrically disposed on a periphery of the nozzle positioning hole. The angle fixing portion is a rotating disc structure capable of homocentrically rotating relative to the adjustment sheet. Angle auxiliary scales are disposed on an edge of the angle fixing portion and the adjustment sheet at corresponding positions. Two symmetrical angle positioning holes and two symmetrical angle positioning bolts are further disposed on the angle fixing portion. When the angle positioning bolts are inserted into the angle positioning holes and are forced tight, an angle of the angle positioning portion relative to the adjustment sheet is fixed at a preset angle.

14 Claims, 8 Drawing Sheets

(51) Int. Cl.
*B05B 15/68* (2018.01)
*H01L 21/67* (2006.01)
*B05B 15/652* (2018.01)

(58) Field of Classification Search
USPC ...... 239/71, 73, 74, 456, 457, 458, 548, 566
See application file for complete search history.

NOZZLE ADJUSTMENT DEVICE AND NOZZLE ADJUSTMENT METHOD

BACKGROUND

Technical Field

This application relates to a nozzle adjustment device and a nozzle adjustment method, and in particular, to a nozzle adjustment device of a cleaning machine and an adjustment method implemented by using the adjustment device.

Related Art

With wide application of various semiconductor products and development of semiconductor technologies, mass production scales of semiconductor products are growing. Meanwhile, sizes of semiconductor products are also growing, and consequently, semiconductor processes are increasingly complex. However, production of products not only requires high precision, but also requires high efficiency and high automation. Therefore, high requirements are raised for production systems and production processes for producing semiconductor products. To produce semiconductor products, for example, an organic light-emitting display device, a liquid crystal display device, and an amorphous silicon solar cell panel, glass and the like need to be used as a substrate; a plurality of working procedures is performed on the substrate to form a plurality of thin films. Processes such as coating, photoetching, and etching involved in process steps generate dust attached on the substrate, and consequently, the cleanliness of the substrate is affected. The cleanliness of the substrate has a significant influence on the quality of products. Therefore, a cleaning step needs to be performed in steps such as coating, photoetching, and etching, to maintain the surface cleanliness of the substrate in the production process.

Using an organic light-emitting diode (OLED) as an example, to manufacture an OLED, generally, a plurality of process steps is performed on a glass substrate, and then a plurality of thin films is successively deposited on the substrate. The film layers mainly include a transparent anode formed on the glass substrate, and a hole injection layer, a hole transmission layer, a light-emitting layer, an electron transmission layer, and an electron injection layer are sequentially deposited on the anode, and finally, a metal cathode layer is deposited. If dust deposits on the substrate in any of the foregoing process steps, the dust is covered in a forming process of a next film layer. Consequently, the thickness and uniformity of the film layer are affected, the quality of subsequent processes is further affected, and finally, the quality of the OLED is reduced. In view of this, it is of great significance to keep the substrate clean. Therefore, a substrate cleaning apparatus is needed to efficiently clean the substrate as well as ensure high cleanliness of the substrate.

However, currently, the case of axial angle deviation often occurs to nozzles mounted on a cleaning machine during mounting, and consequently, spraying angles and directions of the nozzles are inconsistent. This causes non-uniform spraying and further results in incomplete cleaning.

SUMMARY

To resolve the foregoing technical problem, an objective of this application is to provide a nozzle adjustment device and a nozzle adjustment method. The nozzle adjustment device can adjust, by means of simple operation, a plurality of nozzles mounted on a same spray pipe to consistent directions and angles, to facilitate uniform spraying, thereby resolving the problem of incomplete cleaning.

The objective of this application is achieved and the technical problem thereof is resolved by using the following technical solutions. A nozzle adjustment device provided in this application comprises: an adjustment sheet; a spray pipe positioning unit, comprising spray pipe positioning holes symmetrical in pairs disposed on the adjustment sheet and two spray pipe positioning bolts for being inserted into the spray pipe positioning holes; and a nozzle positioning unit, comprising a nozzle positioning hole disposed at the center of the adjustment sheet and an angle fixing portion homocentrically disposed on a periphery of the nozzle positioning hole, where the angle fixing portion is a rotating disc structure capable of homocentrically rotating relative to the adjustment sheet, angle auxiliary scales are disposed on an edge of the angle fixing portion and the adjustment sheet at corresponding positions, two symmetrical angle positioning holes and two symmetrical angle positioning bolts are further disposed on the angle fixing portion, and when the angle positioning bolts are inserted into the angle positioning holes and are forced tight, an angle of the angle positioning portion relative to the adjustment sheet is fixed at a preset angle.

This application may further resolve the technical problem thereof by using the following technical measures.

In an embodiment of this application, the nozzle positioning hole is sequentially sleeved on a plurality of nozzles of a spray pipe, and meanwhile, the spray pipe positioning bolts are sequentially clamped at a plurality of positions of the spray pipe, to facilitate consistent arrangement of the nozzles.

In an embodiment of this application, the shape of the adjustment sheet is a hexagon, and the spray pipe positioning holes are disposed, in pairs, on lines connecting opposite angles of the hexagon in the shape of symmetrical counterbores.

In an embodiment of this application, the spray pipe positioning holes and the spray pipe positioning bolts comprise corresponding male thread and female thread structures.

In an embodiment of this application, the nozzle positioning hole is a hexagonal nut hole.

In an embodiment of this application, the angle positioning holes are two symmetrical arc-shaped counterbores homocentrically disposed on the periphery of the nozzle positioning hole.

In an embodiment of this application, the angle positioning holes and the angle positioning bolts comprise corresponding male thread and female thread structures.

In an embodiment of this application, the nozzle adjustment device is made of a metal material or a plastic material.

This application further includes a nozzle adjustment method, comprising: providing the nozzle adjustment device; mounting a plurality of nozzles on a plurality of nozzle connectors of a spray pipe; and sequentially sleeving the nozzle positioning hole on the plurality of nozzles of the spray pipe, and meanwhile, sequentially clamping the spray pipe positioning bolts at a plurality of positions of the spray pipe.

In an embodiment of this application, in the nozzle adjustment method, the step of sequentially sleeving the nozzle positioning hole on the plurality of nozzles of the spray pipe, and meanwhile, sequentially clamping the spray pipe positioning bolts at a plurality of positions of the spray pipe comprises: sleeving the nozzle positioning hole on the nozzles; rotating the adjustment sheet, to make the spray pipe positioning holes rotate to an outer edge of the spray pipe; forcing the angle positioning bolts tight to make an angle of the angle fixing portion relative to the adjustment sheet fixed at a preset angle, and inserting the spray pipe positioning bolts to set a pipe diameter; and adjusting the plurality of nozzles mounted on the spray pipe to form consistent arrangement, so that spraying directions of the plurality of nozzles are the same.

In an embodiment of this application, central directions and angles of the plurality of nozzles are consistent.

This application further includes a nozzle adjustment device, comprising: an adjustment sheet in the shape of a hexagon; a spray pipe positioning unit, comprising spray pipe positioning holes symmetrical in pairs disposed on the adjustment sheet and two spray pipe positioning bolts for being inserted into the spray pipe positioning holes; and a nozzle positioning unit, comprising a nozzle positioning hole disposed at the center of the adjustment sheet and an angle fixing portion homocentrically disposed on a periphery of the nozzle positioning hole, where the angle fixing portion is a rotating disc structure capable of homocentrically rotating relative to the adjustment sheet, and angle auxiliary scales are disposed on an edge of the angle fixing portion and the adjustment sheet at corresponding positions; two symmetrical angle positioning holes and two symmetrical angle positioning bolts are further disposed on the angle fixing portion; the spray pipe positioning holes are disposed, in pairs, on lines connecting opposite angles of the hexagon in the shape of symmetrical counterbores, and the nozzle positioning hole is a hexagonal nut hole; the nozzle positioning hole is sequentially sleeved on a plurality of nozzles of a spray pipe, and meanwhile, the spray pipe positioning bolts are sequentially clamped at a plurality of positions of the spray pipe, to facilitate consistent arrangement of the nozzles; and central directions and angles of the plurality of nozzles are consistent.

This application can adjust, by means of simple operation, a plurality of nozzles disposed on a same cleaning spray pipe to consistent directions and angles, to facilitate uniform spraying of the nozzles, thereby achieving a better cleaning effect.

DETAILED DESCRIPTION

Figure 1A:
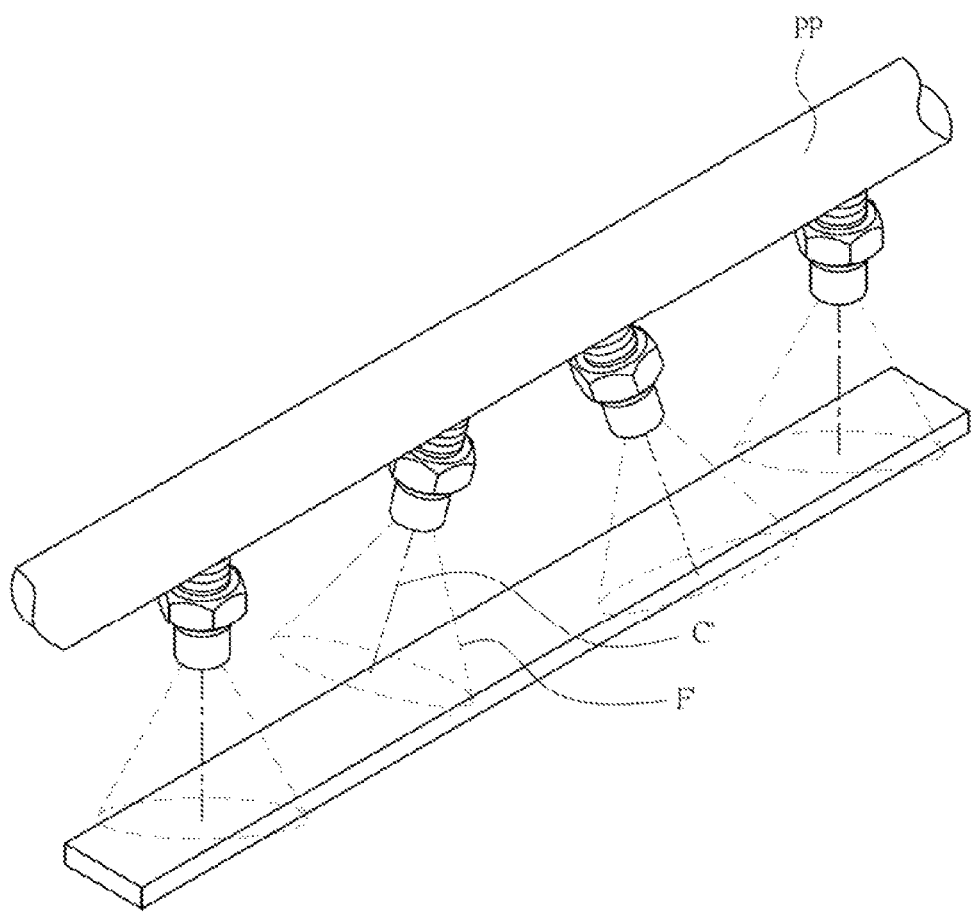
FIG. 1A is a stereoscopic schematic view of exemplary nozzle cleaning.

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions of the accompanying drawings. Therefore, the used terms about directions are used to describe and understand this application, and are not intended to limit this application.

The accompanying drawings and the description are considered to be essentially exemplary, rather than limitative. In figures, units with similar structures are represented by using the same reference number. In addition, for understanding and ease of description, the size and the thickness of each component shown in the accompanying drawings are arbitrarily shown, but this application is not limited thereto.

In the accompanying drawings, for clarity, features of micronic dust particles, substrates, and the like are enlarged. In the accompanying drawings, for understanding and ease of description, angles and directions of some central deviations and cleaning fluids are enlarged. It should be understood that when a component such as an adjustment sheet or a positioning unit is described to be "on" "another component", the component may be directly on the another component, or there may be an intermediate component.

In addition, in this specification, unless otherwise explicitly described to have an opposite meaning, the word "include" is understood as including the component, but not excluding any other component. In addition, in this specification, "on" means that a component is located on or below a target component, but does not mean that the component needs to be located on top of the gravity direction.

To further describe the technical means used in this application to achieve the preset invention objective and effects thereof, specific implementations, structures, features, and effects of a nozzle adjustment device and a nozzle adjustment method provided according to this application are described in detail below with reference to the drawings and preferred embodiments.

To produce semiconductor products, for example, an organic light-emitting display device, a liquid crystal display device, and an amorphous silicon solar cell panel, glass and the like need to be used as a substrate; a plurality of working procedures is performed on the substrate to form a plurality of thin films. Processes such as coating, photoetching, and etching involved in process steps generate dust attached on the substrate, and consequently, the cleanliness of the substrate is affected. The cleanliness of the substrate has a significant influence on the quality of products. Therefore, a cleaning step needs to be performed in steps such as coating, photoetching, and etching, to maintain the surface cleanliness of the substrate in the production process.

Using an OLED as an example, to manufacture an OLED, generally, a plurality of process steps is performed on a glass substrate, and then a plurality of thin films is successively deposited on the substrate. The film layers mainly include a transparent anode formed on the glass substrate, and a hole injection layer, a hole transmission layer, a light-emitting layer, an electron transmission layer, and an electron injection layer are sequentially deposited on the anode, and finally, a metal cathode layer is deposited. If dust deposits on the substrate in any of the foregoing process steps, the dust is covered in a forming process of a next film layer. Consequently, the thickness and uniformity of the film layer are affected, the quality of subsequent processes is further affected, and finally, the quality of the OLED is reduced.

In view of this, it is of great significance to keep the substrate clean. Therefore, a substrate cleaning apparatus is needed to efficiently clean the substrate as well as ensure high cleanliness of the substrate.

Figure 1B:
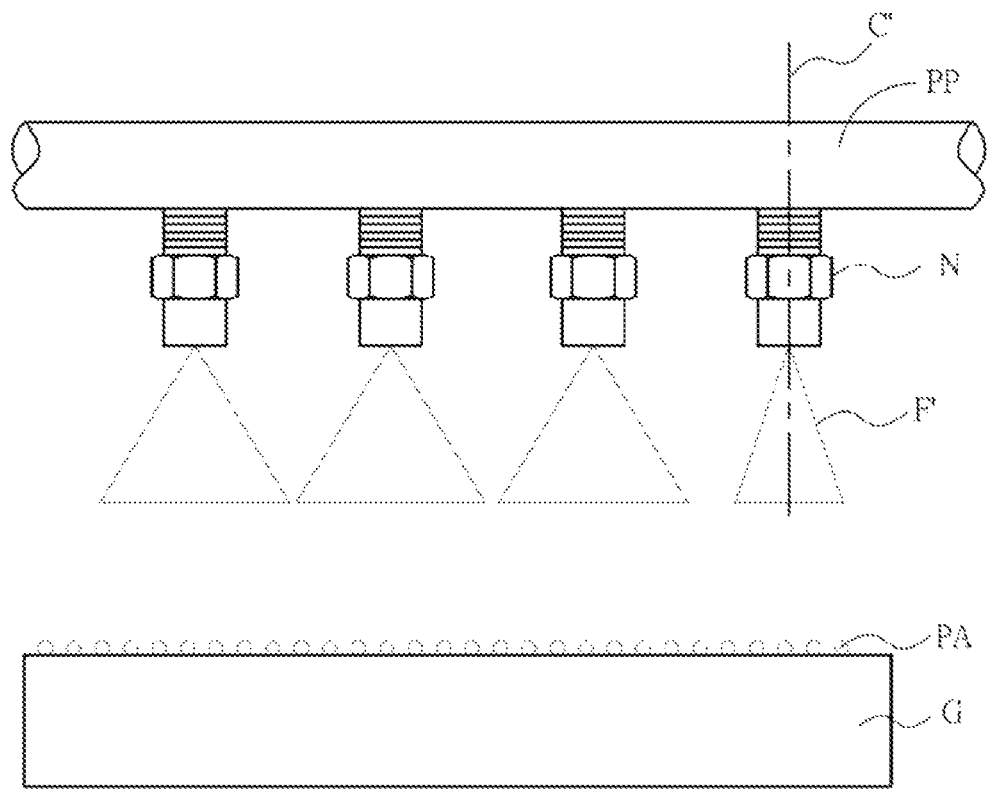
FIG. 1B is a schematic front view of an exemplary nozzle cleaning process.
Figure 1C:
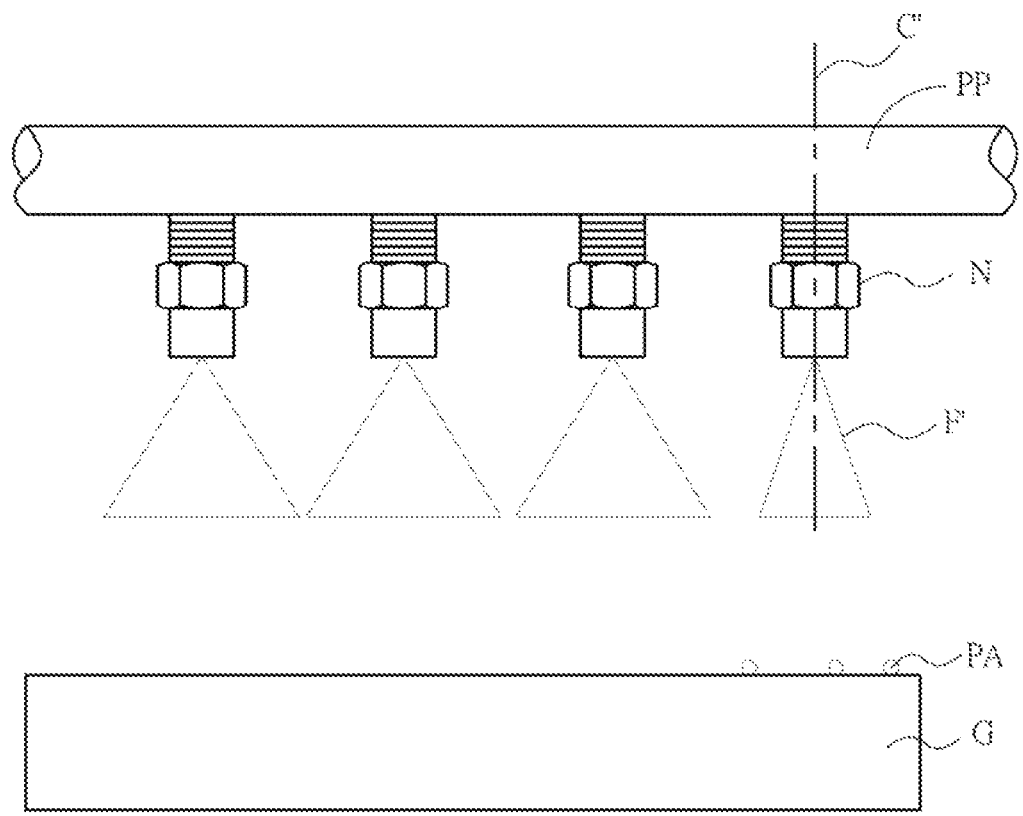
FIG. 1C is a schematic front view of an exemplary nozzle cleaning result.

FIG. 1A is a stereoscopic schematic view of exemplary nozzle cleaning. FIG. 1B is a schematic front view of an exemplary nozzle cleaning process. FIG. 1C is a schematic front view of an exemplary nozzle cleaning result. As shown in the figures, in an exemplary cleaning device, nozzles N mounted on a spray pipe PP usually have the phenomenon of deviation of centers C' due to inconvenient alignment during mounting, and consequently, directions of cleaning fluids F' sprayed by the nozzles N are inconsistent.

If the directions of the cleaning fluids F' sprayed by the nozzles N are inconsistent, then in the cleaning process, as shown in FIG. 1B, cleaning areas obtained by performing spraying by the cleaning fluids F' to a substrate G are inconsistent due to the impact of the deviation of the centers C', further leading to the cleaning result of FIG. 1C, that is, micronic dust particles PA are incompletely cleaned due to non-uniform cleaning strengths.

To resolve the foregoing technical problem, this application provides a nozzle adjustment device, which can adjust, by means of simple operation, a plurality of nozzles mounted on a same spray pipe to consistent directions and angles, to facilitate uniform spraying, thereby resolving the problem of incomplete cleaning.

Figure 2:
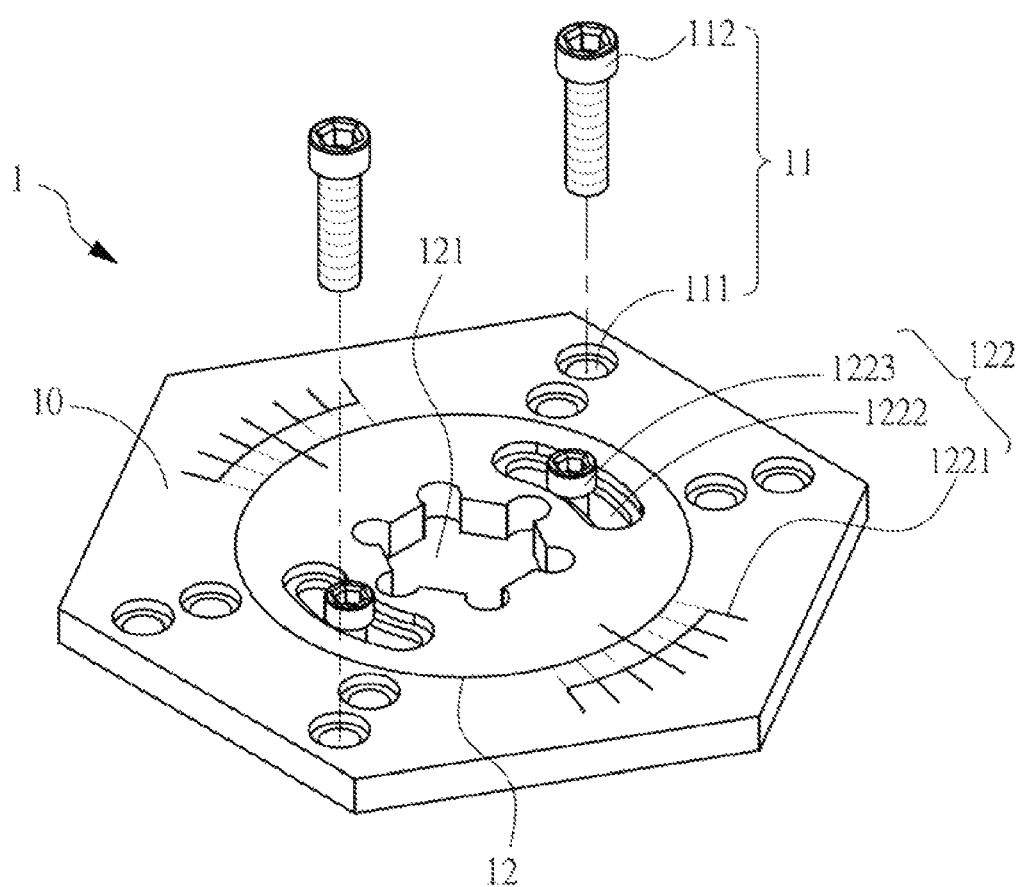
FIG. 2 is a schematic structural diagram of a nozzle adjustment device according to this application.

In an embodiment of this application, a nozzle adjustment device 1 having a structure shown in FIG. 2 includes: an adjustment sheet 10; a spray pipe positioning unit 11, including spray pipe positioning holes 111 symmetrical in pairs disposed on the adjustment sheet 10 and two spray pipe positioning bolts 112 for being inserted into the spray pipe positioning holes 111; and a nozzle positioning unit 12 including a nozzle positioning hole 121 disposed at the center of the adjustment sheet 10 and an angle fixing portion 122 homocentrically disposed on a periphery of the nozzle positioning hole. The angle fixing portion 122 is a rotating disc structure capable of homocentrically rotating relative to the adjustment sheet 10. Angle auxiliary scales 1221 are disposed on an edge of the angle fixing portion 122 and the adjustment sheet 10 at corresponding positions. Two symmetrical angle positioning holes 1222 and two symmetrical angle positioning bolts 1223 are further disposed on the angle fixing portion 122. When the angle positioning bolts 1223 are inserted into the angle positioning holes 1222 and are forced tight, an angle of the angle positioning portion 122 relative to the adjustment sheet 10 is fixed at a preset angle.

In an embodiment, the nozzle positioning hole 121 of this application is sequentially sleeved on a plurality of nozzles N of a spray pipe PP (as shown in FIG. 1A). Meanwhile, the spray pipe positioning bolts 112 are sequentially clamped at a plurality of positions of the spray pipe PP, to facilitate consistent arrangement of the nozzles N.

In an embodiment, the shape of the adjustment sheet 10 of this application is a hexagon, and the spray pipe positioning holes 111 are disposed, in pairs, on lines connecting opposite angles of the hexagon in the shape of symmetrical counterbores.

In an embodiment, the spray pipe positioning holes 111 and the spray pipe positioning bolts 112 of this application include corresponding male thread and female thread structures.

In an embodiment, the nozzle positioning hole 121 of this application is a hexagonal nut hole.

In an embodiment, the angle positioning holes 1222 of this application are two symmetrical arc-shaped counterbores homocentrically disposed on the periphery of the nozzle positioning hole 121.

In an embodiment, the angle positioning holes 1222 and the angle positioning bolts 1223 of this application include corresponding male thread and female thread structures.

In an embodiment, the nozzle adjustment device 1 of this application is made of a metal material or a plastic material.

In an embodiment, central directions and angles of the plurality of nozzles N are consistent.

Figure 3A:
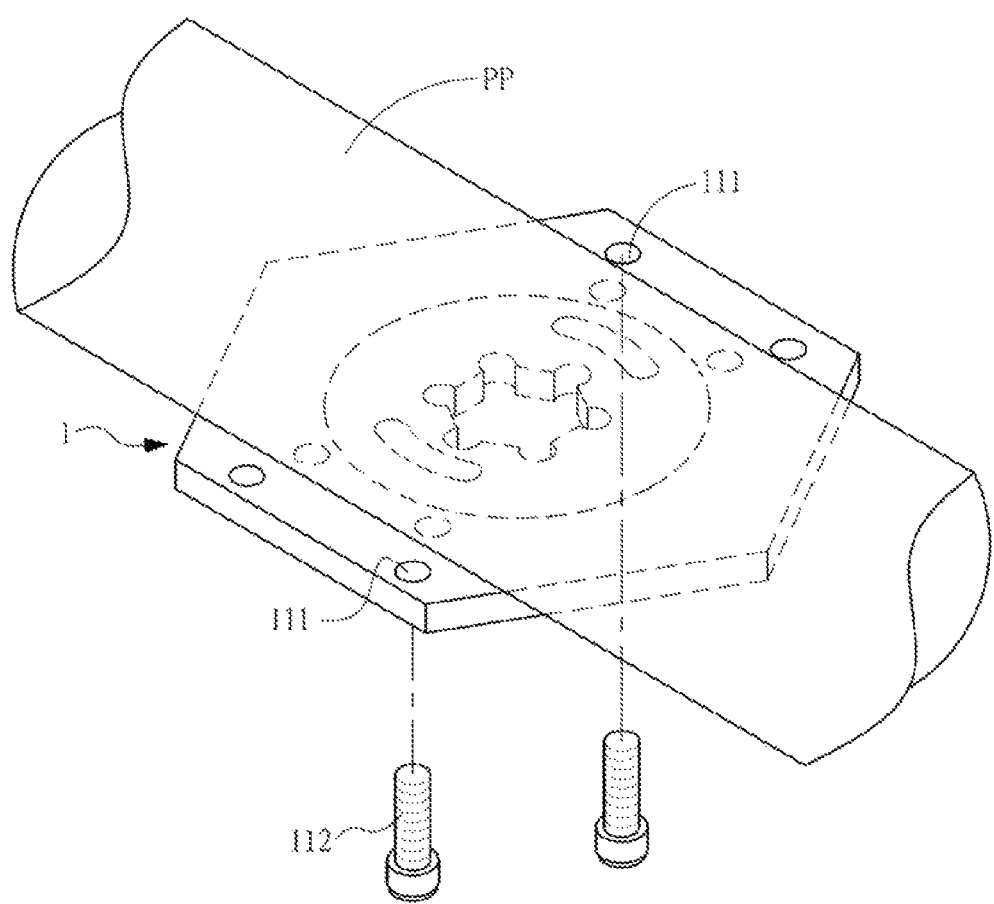
FIG. 3A is a schematic diagram of an upper part of an adjustment method for implement nozzle adjustment according to this application.
Figure 3B:
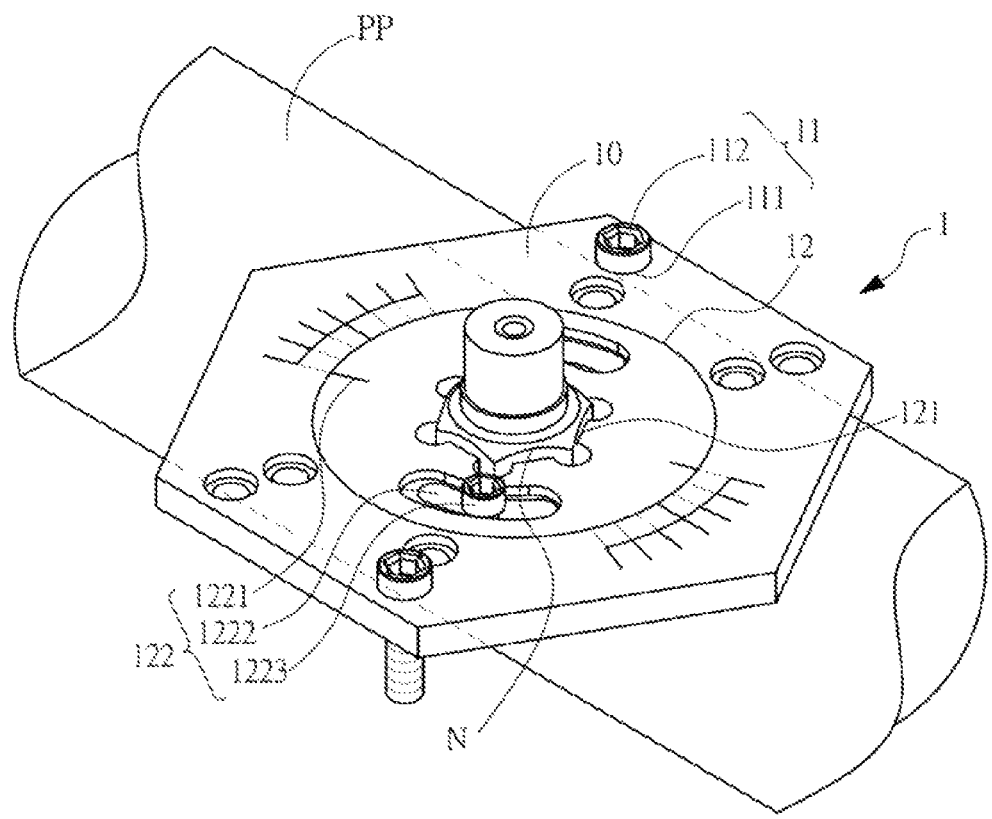
FIG. 3B is a schematic diagram of a lower part of the adjustment method for implement nozzle adjustment according to this application.

Next, referring to FIG. 3A and FIG. 3B, FIG. 3A is a schematic diagram of an upper part of an adjustment method for implement nozzle adjustment according to this application; and FIG. 3B is a schematic diagram of a lower part of the adjustment method for implement nozzle adjustment according to this application.

As shown in FIG. 3A and FIG. 3B, in an embodiment of this application, a nozzle adjustment method includes: providing a nozzle adjustment device 1 described above; mounting a plurality of nozzles N on a plurality of nozzle connectors of a spray pipe PP; and sequentially sleeving the nozzle positioning hole 121 on the plurality of nozzles N of the spray pipe PP, and meanwhile, sequentially inserting the spray pipe positioning bolts 112 into the spray pipe positioning holes 111 to clamp the spray pipe positioning bolts 112 at a plurality of positions of the spray pipe PP.

The foregoing adjustment method of this application is shown in FIG. 3B. Same components are marked with same reference signs. The step of sequentially sleeving the nozzle positioning hole 121 on the plurality of nozzles N of the spray pipe PP, and meanwhile, sequentially clamping the spray pipe positioning bolts 112 at a plurality of positions of the spray pipe PP includes: sleeving the nozzle positioning hole 121 on the nozzles N; rotating the adjustment sheet 10, to make the spray pipe positioning holes 111 rotate to an outer edge of the spray pipe PP; forcing the angle positioning bolts 1223 tight to make an angle of the angle fixing portion 122 relative to the adjustment sheet 10 fixed at a preset angle, and inserting the spray pipe positioning bolts 112 to set a pipe diameter; and adjusting the plurality of nozzles N mounted on the spray pipe PP to form consistent arrangement, so that spraying directions of the plurality of nozzles N are the same. Central directions and angles of the plurality of nozzles are consistent.

Figure 4A:
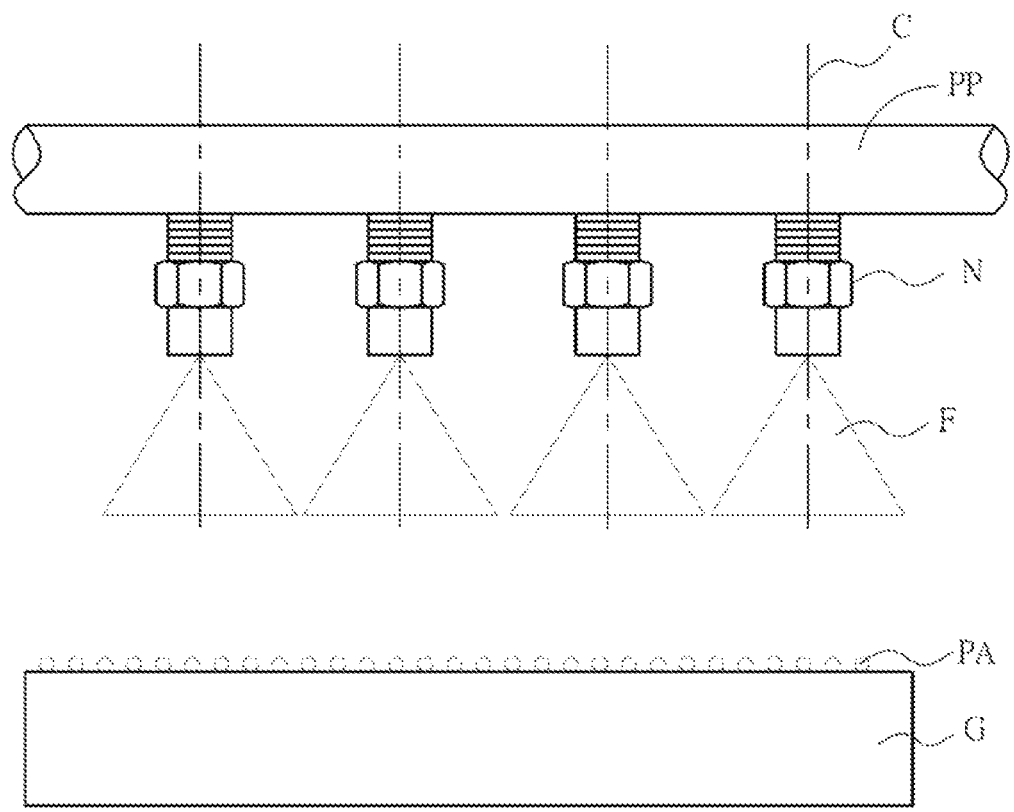
FIG. 4A is a schematic front view of a nozzle cleaning process according to this application.
Figure 4B:
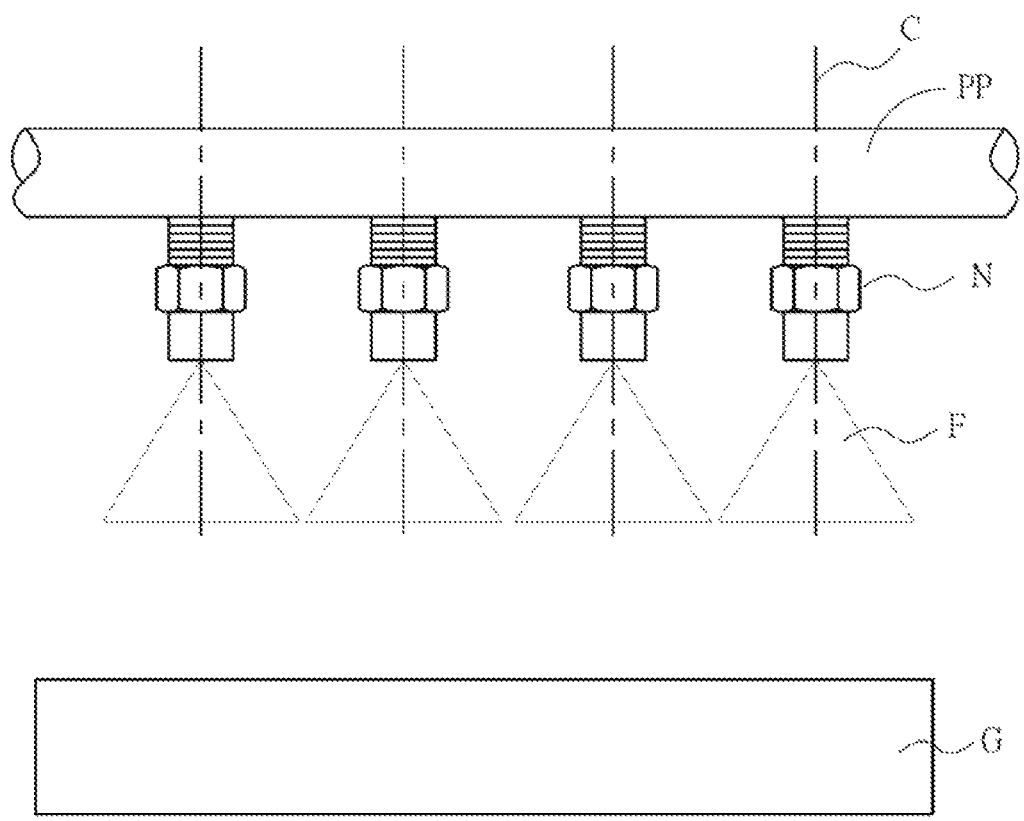
FIG. 4B is a schematic front view of a nozzle cleaning result according to this application.

Refer to FIG. 4A and FIG. 4B for a nozzle cleaning process and a nozzle cleaning result of a cleaning device adjusted by means of the adjustment method by using the nozzle adjustment device according to this application. FIG. 4A is a schematic front view of a nozzle cleaning process according to this application; and FIG. 4B is a schematic front view of a nozzle cleaning result according to this application.

As shown in FIG. 4A, in the cleaning device adjusted by means of the adjustment method by using the foregoing nozzle adjustment device, directions and angles of centers C of the nozzles N mounted on the spray pipe PP are both consistent. Therefore, directions and angles of cleaning fluids F sprayed by the nozzles N are also uniform and consistent. In this way, when a substrate G is cleaned, dust particles PA on the substrate G are uniformly cleaned, to effectively reduce the cases of incomplete cleaning.

This application can adjust, by means of simple operation, a plurality of nozzles disposed on a same cleaning spray pipe to consistent directions and angles, to facilitate uniform spraying of the nozzles, thereby achieving a better cleaning effect.

Terms such as "in some embodiments" and "in various embodiments" are repeatedly used. Usually, the terms do not refer to the same embodiment; but they may also refer to the same embodiment. Words such as "comprise", "have", "include" are synonyms, unless other meanings are indicated in the context.

The foregoing descriptions are merely preferred embodiments of this application, and are not intended to limit this application in any form. Although this application has been disclosed above through the preferred embodiments, the embodiments are not intended to limit this application. Any person skilled in the art can make some equivalent variations or modifications according to the foregoing disclosed technical content without departing from the scope of the technical solutions of this application to obtain equivalent embodiments. Any simple amendment, equivalent change or modification made to the foregoing embodiments according to the technical essence of this application without departing from the content of the technical solutions of this application shall fall within the scope of the technical solutions of this application.

What is claimed is:

1. A nozzle adjustment device, comprising:
   an adjustment sheet;
   a spray pipe positioning unit, comprising spray pipe positioning holes symmetrical in pairs disposed on the adjustment sheet and two spray pipe positioning bolts for being inserted into the spray pipe positioning holes; and
   a nozzle positioning unit, comprising a nozzle positioning hole disposed at the center of the adjustment sheet and an angle fixing portion homocentrically disposed on a periphery of the nozzle positioning hole, wherein the angle fixing portion is a rotating disc structure capable of homocentrically rotating relative to the adjustment sheet, angle auxiliary scales are disposed on an edge of the angle fixing portion and the adjustment sheet at corresponding positions, two symmetrical angle positioning holes and two symmetrical angle positioning bolts are further disposed on the angle fixing portion, and when the angle positioning bolts are inserted into the angle positioning holes and are forced tight, an angle of the angle positioning portion relative to the adjustment sheet is fixed at a preset angle.

2. The nozzle adjustment device according to claim 1, wherein the nozzle positioning hole is sequentially sleeved on a plurality of nozzles of a spray pipe, and meanwhile, the spray pipe positioning bolts are sequentially clamped at a plurality of positions of the spray pipe, to facilitate consistent arrangement of the nozzles.

3. The nozzle adjustment device according to claim 1, wherein the shape of the adjustment sheet is a hexagon.

4. The nozzle adjustment device according to claim 3, wherein the spray pipe positioning holes are disposed, in pairs, on lines connecting opposite angles of the hexagon in the shape of symmetrical counterbores.

5. The nozzle adjustment device according to claim 1, wherein the spray pipe positioning holes and the spray pipe positioning bolts comprise corresponding male thread and female thread structures.

6. The nozzle adjustment device according to claim 1, wherein the nozzle positioning hole is a hexagonal nut hole.

7. The nozzle adjustment device according to claim 1, wherein the angle positioning holes are two symmetrical arc-shaped counterbores homocentrically disposed on the periphery of the nozzle positioning hole.

8. The nozzle adjustment device according to claim 1, wherein the angle positioning holes and the angle positioning bolts comprise corresponding male thread and female thread structures.

9. The nozzle adjustment device according to claim 1, wherein the nozzle adjustment device is made of a metal material.

10. The nozzle adjustment device according to claim 1, wherein the nozzle adjustment device is made of a plastic material.

11. A nozzle adjustment method, comprising:
    providing a nozzle adjustment device according to claim 1;
    mounting a plurality of nozzles on a plurality of nozzle connectors of a spray pipe; and
    sequentially sleeving the nozzle positioning hole on the plurality of nozzles of the spray pipe, and meanwhile, sequentially clamping the spray pipe positioning bolts at a plurality of positions of the spray pipe.

12. The nozzle adjustment method according to claim 11, wherein the step of sequentially sleeving the nozzle positioning hole on the plurality of nozzles of the spray pipe, and meanwhile, sequentially clamping the spray pipe positioning bolts at a plurality of positions of the spray pipe comprises:
    sleeving the nozzle positioning hole on the nozzles;
    rotating the adjustment sheet, to make the spray pipe positioning holes rotate to an outer edge of the spray pipe;
    forcing the angle positioning bolts tight to make an angle of the angle fixing portion relative to the adjustment sheet fixed at a preset angle, and inserting the spray pipe positioning bolts to set a pipe diameter; and
    adjusting the plurality of nozzles mounted on the spray pipe to form consistent arrangement, so that spraying directions of the plurality of nozzles are the same.

13. The nozzle adjustment method according to claim 11, wherein central directions and angles of the plurality of nozzles are consistent.

14. A nozzle adjustment device, comprising:
    an adjustment sheet in the shape of a hexagon;
    a spray pipe positioning unit, comprising spray pipe positioning holes symmetrical in pairs disposed on the adjustment sheet and two spray pipe positioning bolts for being inserted into the spray pipe positioning holes; and
    a nozzle positioning unit, comprising a nozzle positioning hole disposed at the center of the adjustment sheet and an angle fixing portion homocentrically disposed on a periphery of the nozzle positioning hole, wherein
    the angle fixing portion is a rotating disc structure capable of homocentrically rotating relative to the adjustment sheet, and angle auxiliary scales are disposed on an edge of the angle fixing portion and the adjustment sheet at corresponding positions;
    two symmetrical angle positioning holes and two symmetrical angle positioning bolts are further disposed on the angle fixing portion;
    the spray pipe positioning holes are disposed, in pairs, on lines connecting opposite angles of the hexagon in the shape of symmetrical counterbores, and the nozzle positioning hole is a hexagonal nut hole;
    the nozzle positioning hole is sequentially sleeved on a plurality of nozzles of a spray pipe, and meanwhile, the spray pipe positioning bolts are sequentially clamped at a plurality of positions of the spray pipe, to facilitate consistent arrangement of the nozzles; and central directions and angles of the plurality of nozzles are consistent.

* * * * *